OPERATIONAL AMPLIFIER CONTROLLING OPPOSITE-CONDUCTIVITY TYPE SWITCHES FOR PROVIDING UNIPOLAR OUTPUT PROPORTIONAL TO ABSOLUTE VALUE OF INPUT SIGNAL

Filed Nov. 22, 1967

INVENTOR.
ROBERT E. BICKING
BY Bruce C Lutz
ATTORNEY

United States Patent Office 3,509,372

Patented Apr. 28, 1970

3,509,372

OPERATIONAL AMPLIFIER CONTROLLING OPPOSITE-CONDUCTIVITY TYPE SWITCHES FOR PROVIDING UNIPOLAR OUTPUT PROPORTIONAL TO ABSOLUTE VALUE OF INPUT SIGNAL

Robert E. Bicking, Brooklyn Center, Minn., assignor to Honeywell Inc., Minneapolis, Minn., a corporation of Delaware Filed Nov. 22, 1967, Ser. No. 685,061
Int. Cl. H03k 5/20
U.S. Cl. 307—236 6 Claims

ABSTRACT OF THE DISCLOSURE

A circuit for producing a unipolar output signal having a magnitude which is proportional to the absolute value of an input signal.

The invention herein described was made in the course of or under a contract or subcontract thereunder, with the Department of the Air Force.

The present invention is generally related to electronic circuitry and more specifically is related to absolute value measuring circuits.

The prior art has many examples of absolute value circuits. However, to obtain a satisfactory operating characteristic, the prior art circuits have generally required the use of two or more operational amplifiers. The present invention, on the other hand, utilizes only a single operational amplifier.

It is therefore an object of this invention to provide an improved absolute value computing circuit using a single amplifying stage.

Other objects and advantages of this invention will be apparent from a reading of the specification and appended claims wherein:

Figure 1:
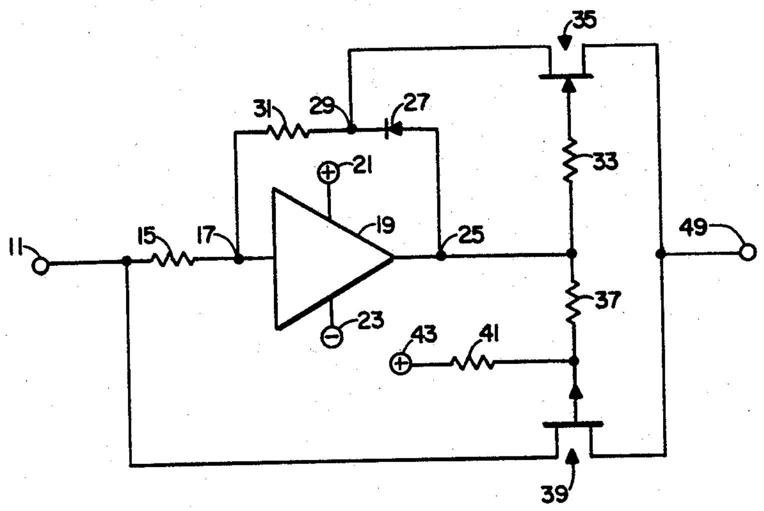
FIGURE 1 is a schematic of a preferred embodiment of the present invention.

In FIGURE 1 an input terminal 11 is connected through a resistor 15 to an input terminal 17 of a high gain inverting amplifier 19. Amplifier 19 is connected to a source of positive power 21 and a source of negative power 23. An output terminal 25 of amplifier 19 is connected to an anode of a diode 27 the cathode of which is connected to a junction point 29. The direction of easy current flow in a diode is defined as from anode to cathode. A resistor 31 is connected between junction point 29 and amplifier input terminal 17. A resistor 33 is connected between amplifier output terminal 25 and a gate terminal of an n-channel field effect transistor 35. The words field effect transistor are hereinafter abbreviated FET. Terminal 25 is also connected through a resistor 37 to a gate terminal of a p-channel FET 39. A resistor 41 is connected between the gate of FET 39 and a source of positive power 43. The junction point 29 is connected to a drain terminal of FET 35. The input 11 is also connected to a drain terminal of FET 39. A source terminal of FET 35 and a source terminal of FET 39 are connected to an output terminal 49.

Figure 2:
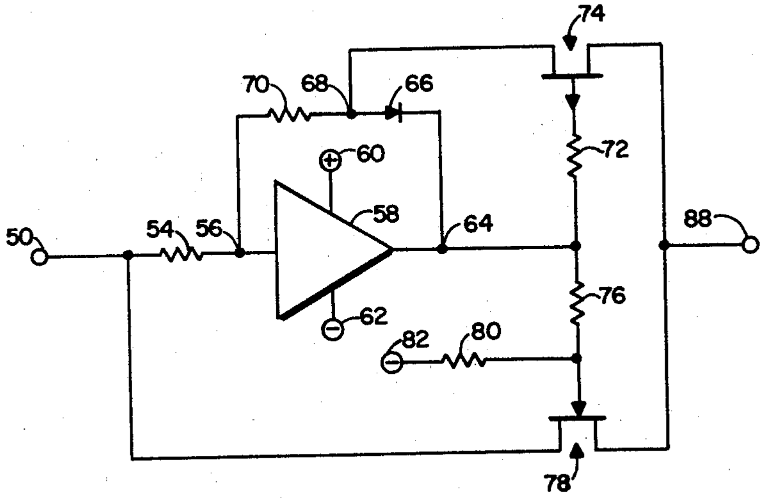
FIGURE 2 is a schematic of a variation of the preferred embodiment.

In FIGURE 2 a circuit similar to that of FIGURE 1 is shown. An input terminal 50 is connected through a resistance 54 to an input terminal 56 of a high gain inverting amplifier 58. Amplifier 58 is connected to a source of positive power 60 and a source of negative power 62. An output terminal 64 of amplifier 58 is connected to a cathode of a diode 66, the anode of which is connected to a junction point 68. Junction point 68 is connected through a resistor 70 to the amplifier input terminal 56. The amplifier output terminal 64 is connected through a resistor 72 to a gate of a p-channel FET 74 and is also connected through a resistor 76 to a gate of an n-channel FET 78. The gate of FET 78 is also connected through a resistor 80 to a source of negative power 82. A drain terminal of FET 74 is connected to junction point 68 and a drain terminal of FET 78 is connected to junction point 52. A source terminal of FET 74 and a source terminal of FET 78 are connected to an output terminal 88.

OPERATION

The circuit shown in FIGURE 1 operates to produce a positive output signal having an amplitude which is proportional to the absolute value of an input signal. If a positive voltage is applied to input terminal 11 a positive current passes through the resistor 15 and applies a positive voltage at input terminal 17 of amplifier 19. Since amplifier 19 is an inverting amplifier, the output voltage appearing at terminal 25 is a negative voltage. The feedback path formed by diode 27 and resistor 31 is ineffective to feed back a negative voltage appearing at output terminal 25 so that the amplifier 19 is operating essentially with no negative feedback when positive signals are applied. Thus, even a small positive voltage applied at terminal 11 will cause a large negative voltage to appear at terminal 25 because of the extremely high open loop gain of amplifier 19. The large negative voltage from amplifier 19 provides a negative voltage at the gate of FET 35 and causes FET 35 to present a high impedance path between its source and drain terminals. FET 39 presents a low impedance path between its source and drain terminals because resistors 37 and 41 are chosen so as to provide a non-positive bias. Therefore, the positive voltages applied at input terminal 11 are conducted to output terminal 49 through FET 39 which acts to shunt amplifier 19. Since the FET when conducting has an extremely low impedance the output impedance at terminal 49 will be quite low.

When a negative input signal is applied at input terminal 11, a positive voltage is produced at output terminal 25 of amplifier 19. A feedback path through diode 27 and resistor 31 is effective for negative input signals. The gain of amplifier 19 from input terminal 11 to junction point 29 is seen to be approximately equal to the ratio of the feedback resistor 31 to the input resistor 15 if the gain of amplifier 19 is quite large. The positive signal appearing at output terminal 25 removes the negative bias from FET 35 causing a low impedance path to be formed between the source terminal and the drain terminal. The gate of FET 39 is biased positive so that the FET has a high impedance between its source and drain terminals. The signal at junction point 29 is thus conducted through the low impedance of FET 35 to output terminal 49. If the magnitude of resistor 31 is equal to the magnitude of resistor 15, the output voltage at terminal 49 for negative input voltages will be a positive voltage having a magnitude essentially equal to the magnitude of the negative input signal.

From the above it can be seen that I have provided a circuit which provides an output signal which has a magnitude approximately equal to the absolute value of an input signal by inverting the input signal if it is negative and passing it through a shunt switch to an output termial or merely shunting an input signal to the output terminal when the input signal is positive.

A circuit for providing an output which is equal to the negative of the absolute value of an input signal is shown in FIGURE 2. FIGURE 2 is similar to FIGURE 1 with the exception that the orientation of diode 66 is reversed from diode 27 in FIGURE 1. FET 74 in FIGURE 2 is a p-channel FET while FET 35 in FIGURE 1 was an n-channel FET. FET 78 in FIGURE 2 is an n-channel FET while FET 39 in FIGURE 1 was a p-channel FET. Lastly, power source 82 is negative in FIGURE 2 while the power source 43 in FIGURE 1 was positive.

When a negative input signal is applied to input terminal 50 the inverting action of amplifier 58 produces a positive output signal at output terminal 64. The feedback path comprising diode 66 and resistor 70 is ineffective to feed a positive signal back to the input terminal 56 of amplifier 58 and the amplifier 58 operates essentially in the high gain open loop condition. Because of the large gain of amplifier 58 the voltage at terminal 64 for even a very small negative input voltage at terminal 50 is a large positive voltage. The high positive voltage at output terminal 64 acts to reverse bias FET 74 and allow a low impedance path to be produced between input terminal 50 and output terminal 88 through FET 78.

When positive input signals are applied to input terminal 50, the negative voltages are produced at output terminal 64 of amplifier 58. Negative feedback through diode 66 and resistor 70 acts to reduce the gain of amplifier 58 and the gain between input terminal 50 and junction point 68 is equal to the ratio of the impedance of resistor 70 and resistor 54. When resistor 70 and 54 are of equal magnitude, the voltage appearing at junction point 68 is equal to the inverse of the voltage applied at input terminal 50. The negative voltage appearing at terminal 64 acts to reverse bias FET 78 and forward bias FET 72. Thus, the voltage appearing at junction point 68 is conducted through a low impedance path through FET 74 to output terminal 88.

Although the detailed explanation described biasing techniques for junction FETs it is clear that other varieties of FET may be substituted using known design techniques.

Other alterations and variations will be obvious to those skilled in the art. I do not wish to be limited to the specification or the preferred embodiment as shown in the figures but only by the following claims.

I claim:

1. A circuit, for providing at an output terminal a signal which is indicative of the absolute value of an analog signal applied to an input terminal, comprising:
- amplifier means including input means and output means;
- means connecting the input terminal of said circuit to the input means of said amplifier means;
- unipolar feedback means connected between the output means and the input means of said amplifier means;
- first switching means connected to said feedback means to receive a signal indicative of the signal of a first polarity appearing at the output of said amplifier and to the output terminal of said circuit, said first switching means being conductive when a bias of the first polarity is applied;
- second switching means connected between the input terminal and the output terminal of said circuit, said second switching means being conductive when a bias of a second polarity is applied;
- signal responsive bias means connected to said first switching means, said second switching mean, and the output mean of said amplifier means for actuating said first switching means upon reception of circuit input signals of the second polarity and for actuating said second switching means upon reception of circuit input signals of the first polarity.

2. Apparatus of the class described in claim 1 wherein the feedback means comprises a series connection of a unidirectional current conducting means connected to the output means of said amplifier means and impedance means connected to the input means of said amplifier means and wherein the first switching means is connected to a junction point between said unidirectional current conducting means and said impedance means.

3. Apparatus of the class described in class 2 wherein said unidirectional current conducting means is a diode and said first switching means and said switching means are field effect transistors.

4. A circuit for producing at an output terminal, a signal which is proportional to the absolute value of an input signal applied to an input terminal, comprising:
- signal polarity inverting amplifier means including input means and output means;
- unidirectional current conducting means connected at one end to the output means of said amplifier means, said unidirectional current conducting means oriented for conducting signals of a given polarity from the output means of said amplifier means;
- feedback means connecting said unidirectional current conducting means to the input means of said amplifier means;
- first switching means having first, second, and third terminals, said first switching means providing a conductive path between the first and the second terminals when a signal of a one polarity is connected to the third terminal, the first terminal of said first switching means being connected to the unidirectional current conducting means and the second terminal of said first switching means being connected to the output terminal of said circuit;
- second switching means having first, second, and third terminals, said second switching means providing a conductive path between the first and second terminals when a signal of a polarity opposite said one polarity is connected to the third terminal means, the first terminal means of said second switching means being connected to the input means of said circuit, the second terminal of said second switching means being connected to the output means of said circuit;
- a source of bias potential of said given polarity;
- first impedance means connecting the source of bias potential to the third terminal of said second switching means;
- second impedance means connecting the third terminal of said second switching means to the output means of said amplifier means;
- third impedance means connecting the third terminal of said first switching means to the output means of said amplifier means.

5. Apparatus of the class described in claim 4 wherein said first switching means and said second switching means are field effect transistor.

6. Apparatus of the class described in claim 4 wherein said feedback means and said first impedance means have the same impedance for producing an output at the output means of said circuit whose magnitude is substantially equal to the absolute value of the input signal applied to the input means of said circuit.

References Cited

UNITED STATES PATENTS 2,292,098 12/1966 Bensing ---------- 307—236 X

DONALD D. FORRER, Primary Examiner

S. D. MILLER, Assistant Examiner

U.S. Cl. X.R.

307—235, 251, 230; 328—150